United States Patent
Huffman et al.

(10) Patent No.: US 7,661,054 B2
(45) Date of Patent: Feb. 9, 2010

(54) METHODS AND ARRANGEMENTS TO REMAP DEGRADED STORAGE BLOCKS

(75) Inventors: Amber D. Huffman, Banks, OR (US); Knut S. Grimsrud, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 233 days.

(21) Appl. No.: 11/239,894

(22) Filed: Sep. 30, 2005

(65) Prior Publication Data
US 2007/0089031 A1     Apr. 19, 2007

(51) Int. Cl.
G06F 11/00 (2006.01)
G11C 29/00 (2006.01)

(52) U.S. Cl. .............................. 714/746; 714/8; 714/25; 714/718

(58) Field of Classification Search ..................... 714/8, 714/25, 718, 746
See application file for complete search history.

(56) References Cited

U.S. PATENT DOCUMENTS

| | | | | |
|---|---|---|---|---|
| 5,802,069 A | * | 9/1998 | Coulson | 714/718 |
| 6,266,677 B1 | * | 7/2001 | Rodgers et al. | 707/200 |
| 6,606,714 B1 | * | 8/2003 | Thelin | 714/8 |
| 6,654,193 B1 | * | 11/2003 | Thelin | 360/53 |
| 7,133,339 B2 | * | 11/2006 | Sasaki | 369/53.17 |
| 7,586,821 B2 | * | 9/2009 | Sasaki | 369/53.17 |

* cited by examiner

Primary Examiner—John J Tabone, Jr.
(74) Attorney, Agent, or Firm—Schubert, Osterrieder & Nickelson, PLLC

(57) ABSTRACT

Methods and arrangements to remap degraded storage blocks on, e.g., IDE/ATA drives are disclosed. Embodiments may comprise a host and/or a data storage device for, e.g., a handheld device. The host may comprise remapping logic. In many embodiments, the remapping logic may track degraded storage blocks as indicated by the data storage device. In several embodiments, the host may remap data from degraded storage blocks in response to indications from the data storage device that the degraded storage blocks have degraded to a point at which further use may risk loss of data. The data storage device may execute error correction code to acquire valid data and if error correction measures exceed a threshold, or are otherwise determined to be excessive, the data storage device may communicate the degradation of the storage block to the host. Other embodiments may be disclosed and claimed.

30 Claims, 6 Drawing Sheets

| REGISTER ADDRESS | ATA REGISTER (8-BIT) | RESET VALUE (READ) | | | | | | | |
|---|---|---|---|---|---|---|---|---|---|
| 0 | CONTROL | R | R | R | R | R | R | 1 | 0 |
| 1 | FEATURES (EXP) | RESERVED | | | | | | | |
| 2 | SECT OR COUNT (EXP) | RESERVED | | | | | | | |
| 3 | LBA LOW (EXP) | RESERVED | | | | | | | |
| 4 | LBA MID (EXP) | RESERVED | | | | | | | |
| 5 | LBA HIGH (EXP) | RESERVED | | | | | | | |
| 6 | RESERVED | RESERVED | | | | | | | |
| 7 | RESERVED | RESERVED | | | | | | | |
| 8 | RESERVED | R | R | R | R | R | R | 1 | 0 |
| 9 | FEATURES/ ERROR | 01h | | | | | | | |
| 10 | SECT OR COUNT | 01h | | | | | | | |
| 11 | LBA LOW | 01h | | | | | | | |
| 12 | LBA MID | CEh | | | | | | | |
| 13 | LBA HIGH | AAh | | | | | | | |
| 14 | DEVICE/HEAD | RESERVED | | | | | | | |
| 15 | COMMAND STATUS | 0 | R | 1 | R | R | R | R | 0 |

FIG 2

METHODS AND ARRANGEMENTS TO REMAP DEGRADED STORAGE BLOCKS

FIELD

The present invention is in the field of data storage. More particularly, the present invention relates to methods and arrangements to remap degraded storage blocks.

BACKGROUND

Retrieval of data from storage devices inevitably involves errors whether the errors are one bit in a billion or one bit in a hundred billion. Furthermore, with use and age, portions of the storage devices begin to realize increasing numbers of errors. To reduce the impact of such errors, typical controllers for storage devices such as random access memory, flash memory, hard drives, and optical media include error correction code (ECC) to detect and correct for bit errors. ECC can correct at least single bit errors in the data on the fly, significantly improving the speed and accuracy of data retrieval.

ECC can be implemented in multiple levels of complexity. For instance, a low-level ECC may detect and correct simple single bit errors by decoding ECC bits included with the data on the storage medium. When the low-level ECC code is unable to correct errors in data, the data may be reread from the storage medium in an attempt to resolve the errors. If the errors still exist, a more complex ECC algorithm may attempt to resolve the errors. Furthermore, errors may be reported or logged when error correction involves more than the low-level ECC. Reporting or logging the errors facilitates remapping data destined for degraded storage blocks to avoid irreparable loss or corruption of the data.

Current hard drives such as Integrated Drive Electronics (IDE) or AT Attachment (ATA), Serial ATA (SATA), Consumer-Electronics ATA (CE-ATA), and, CompactFlash+ (CF+) drives implement ECC and remapping algorithms to present a pristine image to their host system. In other words, the designers of, e.g., laptops or desktop computers do not need to invest the money and research into developing the most efficient ECC or remapping algorithms for various hard drives on the market because the hard drives handle ECC and remapping in a manner that is invisible to the host system. As a result, interfaces such as ATA comprise command sets that assume ECC and remapping are performed by the hard drives. Many hard drives with Self Monitoring Analysis and Reporting Technology (SMART) logic also determine whether the drive appears to be failing and report such determinations to the host system.

The advent of low-cost, handheld products that utilize small hard drives such as personal digital assistants (PDAs), phones, and Moving Pictures Experts Group (MPEG) Audio Layer 3 (MP3) players, is driving the manufacturers of these small hard drives to find new and innovative ways to optimize the size and cost of the drives and decrease the time-to-market [see ISO/IEC JTC1/SC29/WG11 MPEG, "International Standard IS 13818-3 Information Technology—Generic Coding of Moving Pictures and Associated Audio, Part 3: Audio", published 1994; and ISO/IEC JTC1/SC29/WG11 N1229, "MPEG-2 Backwards Compatible CODECS Layer II and III: RACE dTTb Listening Test Report", Florence, published March 1996]. With regards to the small hard drives, e.g., 1.8 inch, 1.0 inch, and 0.85 inch form factor hard drives, a major portion of the costs for developing and building the drives includes costs for development and memory and a major portion of the time-to-market is utilized in developing and debugging remapping algorithms. The cost of development is significantly impacted by development of fairly complex remapping algorithms. The cost of the memory is significantly impacted by the large incremental costs for the small, non-standard sizes of dynamic random access memory (DRAM) necessary to execute the remapping algorithms. Hosts for such products, on the other hand, typically have significantly larger sizes of memory, which have smaller incremental costs.

BRIEF DESCRIPTION OF THE DRAWINGS

Advantages of the invention will become apparent upon reading the following detailed description and upon reference to the accompanying drawings in which like references may indicate similar elements:

FIG. 2 depicts an embodiment of an initialization signature for the data storage device of FIG. 1;

DETAILED DESCRIPTION OF EMBODIMENTS

The following is a detailed description of embodiments of the invention depicted in the accompanying drawings. The embodiments are in such detail as to clearly communicate the invention. However, the amount of detail offered is not intended to limit the anticipated variations of embodiments, but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, methods and arrangements to remap degraded storage blocks on, e.g., IDE/ATA drives are contemplated. Embodiments may comprise a host and/or a data storage device. The host and data storage device may form, e.g., a handheld device such as an MP3 player, a cellular phone, or the like. The host may comprise a processor and memory to implement remapping logic. In many embodiments, the remapping logic may track degraded storage blocks as indicated by the data storage device. In several embodiments, the data storage device may communicate with the host to inform the host to remap data from degraded storage blocks. The host may remap data to storage blocks in response to indications from the data storage device that the storage blocks have degraded to a point at which action should be taken by the host to avoid data loss. For example, the data storage device may execute error correction code (ECC) to acquire valid data and if error correction measures exceed a threshold, or are otherwise determined to be excessive, the data storage device may communicate the degradation of the storage block to the host. In further embodiments, the data storage device may verify that the host is capable of remapping.

While portions of the following detailed discussion describes embodiments with reference to specific configurations and protocols, persons of ordinary skill in the art will recognize that embodiments may be implemented with other configurations and other protocols.

Figure 1:
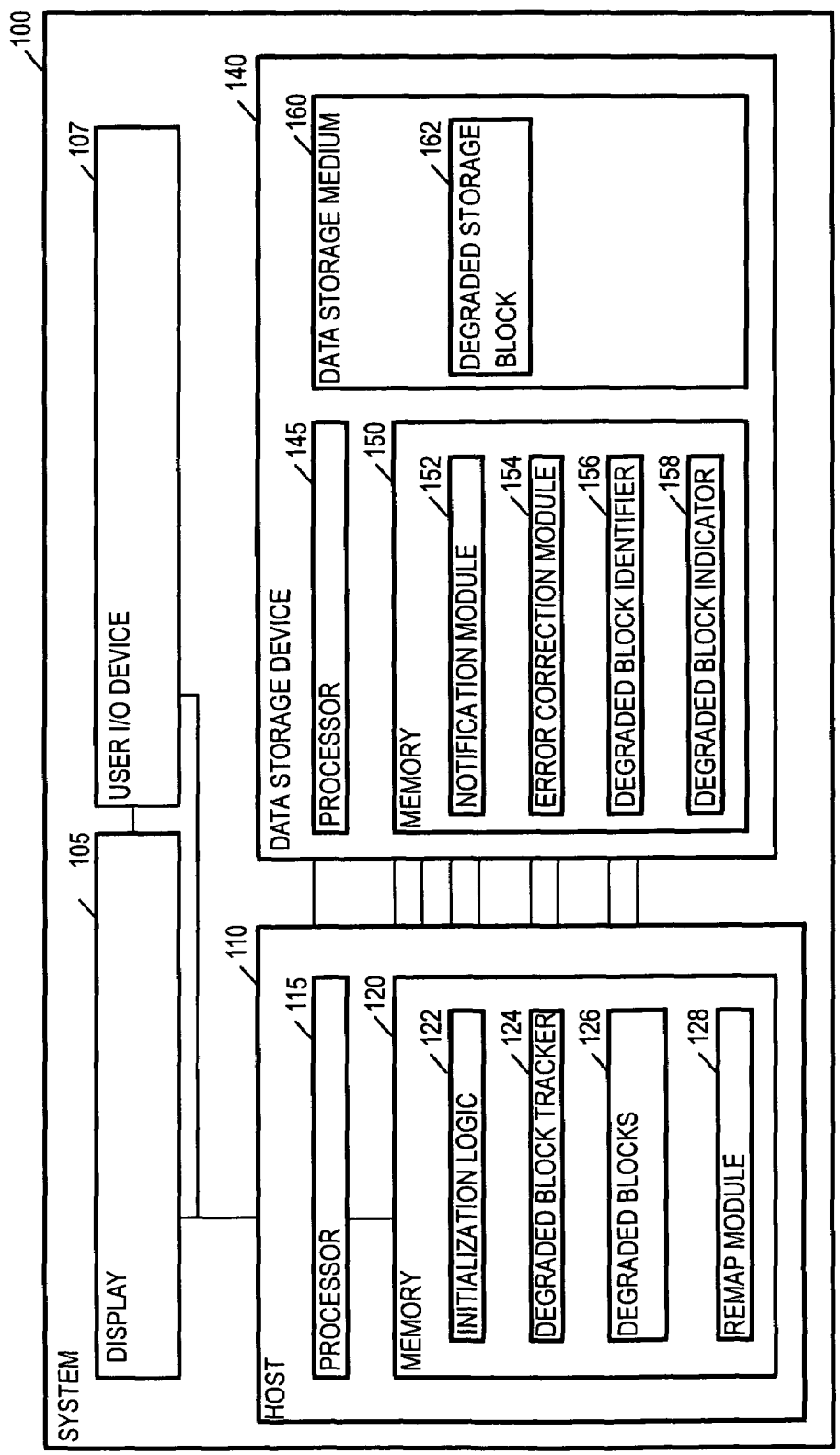
FIG. 1 depicts an embodiment of a system including a host and a data storage device.

Turning now to the drawings, FIG. 1 illustrates an embodiment of a system 100 including a display 105, a user input-output (I/O) device 107, a host 110 and a data storage device 140. System 100 may be, e.g., a portable music player, a portable video player, a smartphone or other cellular phone, a digital video camera, a digital still camera, a personal digital assistant (PDA), an external storage device, or the like. Display 105 and user I/O device 107 may facilitate interaction between host 110 and a user. For example, user I/O device 107 may comprise a number pad, keyboard, joystick, microphone, speaker, and/or the other input-output devices.

Host 110 may comprise logic to perform a set of user functions to interface with a user and data on data storage device 140. For example, host 110 may interact with a user to play songs that are stored on data storage medium 160, receive and send text messages, display names and phone numbers stored on data storage medium 160, and dial phone numbers selected by the user from the numbers stored on data storage medium 160.

Host 110 may comprise a processor 115 coupled with memory 120. Processor 115 may execute microcode, Java™, or other instructions to interact with the user and access information stored in data storage device 140. Memory 120 may comprise random access memory (RAM) such as dynamic random access memory (DRAM) to store instructions and data for execution by processor 115 as well as nonvolatile memory such as flash memory and/or read only memory (ROM). Memory 120 may also comprise a buffer to store data being read from and to be written to data storage device 140.

Memory 120 comprises initialization logic 122, degraded block tracker 124, degraded blocks 126, and remap module 128. Initialization logic 122 may execute on processor 115 to identify data storage device 140 when system 100 is initially powered up. For example, basic input-output coding may instruct processor 115 to execute initialization logic 122 upon booting. Coding of initialization logic 122 may instruct processor 115 to request identification from and/or verification of the existence/proper operation of data storage device 140. In response, processor 115 may receive an initial register image that comprises the device reset or initialization signature.

FIG. 2 illustrates an example of such an initialization signature 200. In FIG. 2, initialization signature 200 comprises a block of data transferred to host 110 in response to the request from host 110. Data storage device 140 may transfer initialization signature 200 to memory 120. Instructions of initialization logic 122 may interpret the content of register addresses 12 and 13, which includes "CEh" 215 and "AAh" 220, respectively, to identify data storage device 140 as a CE-ATA hard drive.

Once host 110 recognizes data storage device 140, initialization logic 122 may issue an IDENTIFY DEVICE command. The IDENTIFY DEVICE command may be a request for data storage device 140 to identify specific parameters of operation such as optional features and capabilities. For instance, data storage device 140 may include, as one feature, the ability to pass responsibility for remapping to host 110 and may explicitly or implicitly lack the capability of remapping data from degraded storage blocks.

Upon receipt of the IDENTIFY DEVICE command, data storage device 140 may return a parameter page to host 110 that outlines the parameters of operation for data storage device 140. The parameter page may comprise, e.g., 512 bytes of data. Instructions of initialization logic 122 may interpret the content of the parameter page to determine that host 110 should track and remap data from degraded storage blocks.

Figure 3:
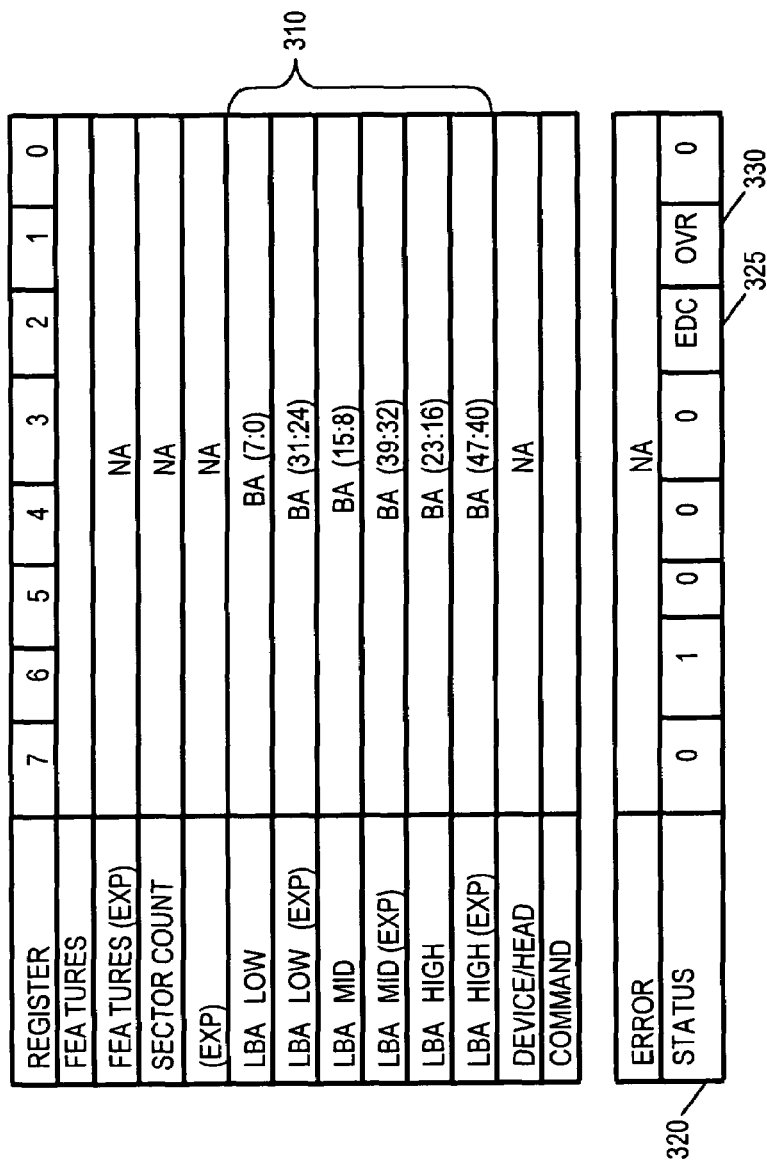
FIG. 3 depicts an embodiment of a read response and read status generated by a storage device in response to a read request to communicate the degradation of a storage block to the host of FIG. 1.

Upon establishing that host 110 will perform remapping functions for data storage device 140, logic of degraded block tracker 124 may instruct processor 115 to monitor access status registers of access responses for indications that storage blocks are degraded to a point that the data should be remapped to a "healthy" storage block, e.g., one that is not identified as degraded. For example, in response to interaction with a user, processor 110 may request that contact information from an address book database be loaded into memory 120. Data storage device 140 may process the request and return an access response 300 that includes a read status 320 as illustrated in FIG. 3.

Processor 110 may read the content of the degraded block indicator "EDC" 325 in a register status 320 portion of the response to the read request. If "EDC" 325 is set to a logical one, the data transfer associated with the read command included a block that required error correction measures such as a level of ECC correction. The logic of degraded block tracker 124 may interpret the bit to indicate a degraded storage block of data storage medium 160 should be remapped to avoid loss of data. In many embodiments, setting "EDC" 325 to a logical one by the storage device indicates that there are one or more degraded storage blocks in data storage medium 160 in a storage region identified by the logical block address (LBA) given as part of the access request, defined by block address "BA" 310. "BA" 310 is 48 bits and the degraded blocks may include any sector in the entire read transfer. The size of the read transfer is determined by the sector count given in the read request.

Degraded block tracker 124 may include instructions, which, when executed by processor 110, instruct processor 110 to locate the degraded blocks of data storage medium 160 by testing a storage region starting at the address identified by the 48-bit "PBA" 310, and then individually testing each sector of the entire transfer. Inclusion of degraded block tracker 124 in host 110 thereby advantageously simplifies remapping code and reduces memory requirements in data storage device 140. In another embodiment, data storage device 140 may identify all sectors that need to be remapped such that individual testing is not necessary.

Logic of degraded block tracker 124 may further instruct processor 110 to store addresses of degraded storage blocks of data storage medium 160 in degraded blocks 126. In other embodiments, addresses for degraded storage blocks may be stored in a reserved location of data storage device 140 such as in data storage medium 160 or other non-volatile memory or data storage.

Upon identifying one or more degraded storage blocks in data storage medium 160 and storing addresses for the blocks in degraded blocks 126, remap module 128 may provide instructions that cause processor 110 to remap data from the degraded storage blocks to other storage blocks within data storage medium 160, which are not identified as degraded storage blocks. In further embodiments, host 110 may reserve a number of storage blocks of data storage medium 160 specifically for remapping data from degraded storage blocks. In a further embodiment, these reserved areas may be strategically "sprinkled" throughout the storage medium to ensure short seek and/or rotational latencies when a degraded block is accessed as part of a larger request.

Data storage device 140 may comprise a small form factor hard drive such as a 1.8 inch, 1.0 inch, or 0.85 inch form factor hard drive. Data storage device 140 may comprise a processor 145, memory 150, and data storage medium 160. Processor 145 may be, e.g., a microcontroller that executes code of memory 150 to access data storage medium 160, execute error correction measures, and interface with host 110. For example, processor 145 may execute code of notification module 152 to transmit an initial register image such as the initial register image illustrated in FIG. 2 to host 110 in response to a request from host 110.

Memory 150 may comprise RAM, flash memory, ROM, and/or the like. Memory 150 may maintain coded logic in non-volatile memory such as notification module 152, error correction module 154, degraded block identifier 156, and a degraded block indicator 158. Notification module 152 may identify data storage device 140 and indicate to host 110 that host 110 is responsible for tracking degraded storage blocks and remapping data from the degraded storage blocks. In some embodiments, host 110 may indicate to the user an error if host 110 is unable to support remapping for data storage device 110.

Error correction module 154 comprises code that is executed by processor 145 to identify and/or correct errors in data read from data storage medium 160. For instance, error correction module 154 may comprise one or more levels of error correction code (ECC). ECC may comprise an algorithm that generates ECC bits to store with data on data storage medium 160. When the data is read from data storage medium 160, ECC bits are read with the data. By adding redundant ECC bits for each block of data stored, one or more errors in the data as read from data storage medium 160 may be corrected without having to reread the data.

When low-level ECC code is unsuccessful in correcting errors in data read from a storage block, the data may be reread and higher level ECC code may be implemented to recover the data. In many embodiments, the ECC algorithms in error correction module 154 can correct multiple-bit errors.

Degraded block identifier 156 may report a sector as degraded before the data is lost. In particular, degraded block identifier 156 may comprise code to identify a degraded storage block 162 when error correction measures exceed a threshold. In some embodiments, degraded block identifier 156 may identify a storage block as degraded when the number of ECC bits being corrected is high enough that the ability of ECC algorithms in error correction module 154 are in danger of being exhausted. For instance, the threshold may delimit the number of bits per block of data that can be corrected by error correction module 154 before the storage block is identified as degraded. If the ability of ECC algorithms are exhausted then error correction module 154 may implement secondary efforts to recover the data with, e.g., re-reads, etc.

In further embodiments, degraded block identifier 156 may identify a storage block as degraded when secondary correction methods are invoked. For example, in many embodiments, the use of low-level ECC algorithms may not exceed the threshold. However, rereading data from degraded storage block 162 and/or implementing higher-level error correction measures may exceed the threshold.

Once degraded storage block identifier 156 identifies degraded storage block 162 as degrading beyond the threshold, degraded block indicator 158 may set status indicators in an access response such as the access response 300 shown in FIG. 3. Degraded storage block identifier 156 may set the indicator "EDC" 325 if degraded block identifier 156 determines that excessive error correction measures are implemented to attempt to acquire the data from data storage medium 160. In most situations, however, if host 110 responds to the indicator "EDC" 325, data should be remapped early enough to avoid the loss of data. In other embodiments, degraded block indicator 158 may indicate a measure of how close the ability of error correction module 154 is to exhaustion for a block rather than or in addition to identifying the block as degraded, offering the host the ability to determine the threshold or whether the extent of the error correction measures warrant remapping data from the storage block. In further embodiments, degraded block indicator 158 may communicate the degradation of a storage block via a signature or another field.

Figure 4:
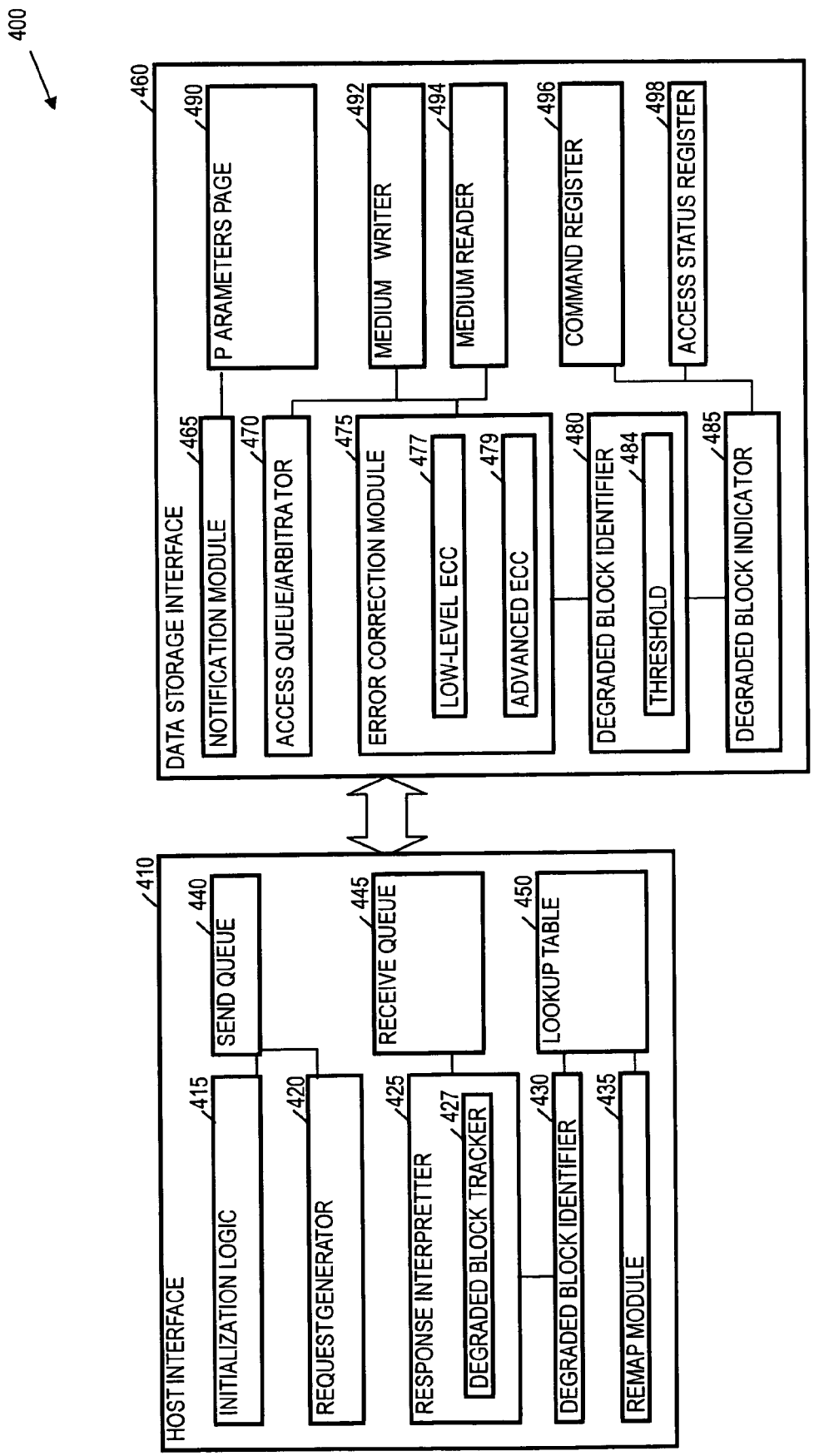
FIG. 4 depicts an embodiment of a host interface and a data storage interface.

FIG. 4 depicts an embodiment 400 of a host interface 410 and a data storage interface 460 to remap storage blocks of a data storage medium. Host interface 410 and data storage interface 460 may comprise logic such as software, firmware, other code, processors, and/or state machines to facilitate interaction between a host and a data storage medium. For example, host interface 410 may communicate with data storage interface 460 to retrieve the text of an email to display for a user.

Host interface 410 comprises initialization logic 415 to transmit a request, e.g., an IDENTIFY DEVICE command, to data storage interface 460 via send queue 440 to identify operational parameters associated with data storage interface 460. A notification module 465 of data storage interface 460 may respond to the request by transmitting data including a parameters page 490 to host interface 410 via receive queue 445. The parameters page 490 may include an indication that data storage interface 460 may pass responsibility of remapping data from degrading storage blocks to host interface 410. In many embodiments, host interface 410 is designed to take over responsibility for remapping around degraded storage blocks from data storage interface 460.

After initial communications transfer responsibility for remapping to host interface 410, a request generator 420 may generate one or more access requests for data storage interface. Send queue 440 may maintain each access request in an order to transmit to data storage interface 460. For instance, send queue 440 may comprise a first-in, first-out queue that transmits requests to data storage interface 460 in the order in which the requests are received from request generator 420.

Data storage interface 460 may receive an access request at access queue/arbitrator 470 to read a storage block. In many embodiments, access queue/arbitrator 470 may weight priorities for accesses based upon the order of receipt and whether the request is a read request or a write request. Error correction module 475 may monitor access to the data storage medium and validate data read from the medium. For example, in response to the read request from host interface 410, medium reader 494 may read data that includes ECC bits from the medium. Error correction module 475 may implement low-level ECC 477 to verify that the ECC bits are consistent with the data retrieved from the storage block. If the data is not validated, low-level ECC 477 may correct the data when the number of bits being corrected in the data is within the capabilities of low-level ECC 477. Otherwise, low-level ECC 477 may fail to acquire valid data from the storage medium.

Similarly, if the access request is a write request, medium writer 492 may write the data along with ECC bits into the storage medium. After writing the data and ECC bits, in some embodiments, host interface 410 may request a verify, in which the data storage interface 460 reads the data and bits back from the storage medium to verify the data write. Then, if the data read from the storage medium is not validated, error correction module 475 may implement low-level ECC, high-level ECC, reread the data from the storage medium, rewrite the data to the storage medium, and etc.

When low-level ECC fails to correct or validate the data read from the storage medium, degraded block identifier 480 may recognize that error correction measures implemented by error correction module 475 have exceeded a threshold 484, or otherwise warrant remapping data from the storage blocks. In response, degraded block identifier 480 may signal degraded block indicator 485 to set an indicator or status value in an access status register 498 and store an address for the storage block in a command register 496. Furthermore, if error correction module 475 fails to acquire the data from the storage medium by rereading the data, implementing more advanced ECC 479 and/or the like, degraded block identifier 480 may communicate the error condition to degraded block indicator 485, which may, e.g., terminate the access to indicate the error to host interface 410.

Once data storage interface 460 acquires or fails to acquire the data from the storage medium, data storage interface 460 may transmit the contents of command register 496 and access status register 498 to host interface 410 via receive queue 445. Response interpreter 425 may interpret the access response and degraded block tracker 427 may respond to the degraded block status being indicated in the access status register 498 by reading the address of the degraded storage block from the content of the command register 496. In many embodiments, the address of the storage block included in the access response may be the address of a storage block in the area of the degraded storage block so degraded block identifier 430 may test storage blocks in the area of the identified storage block to determine if other degraded storage blocks reside in that area. In further embodiments, data storage interface 460 may identify a range of degraded storage blocks. In another embodiment, data storage interface 460 may indicate the exact blocks that are degraded.

A list of the degraded storage blocks may then be stored in a lookup table 450 of host interface 410 to facilitate remapping data associated with the degraded storage blocks to other addresses. When a request to store data in a data storage address is to be transmitted to data storage interface 460, remap module 435 may compare the address and length of the data against the list of degraded storage blocks in lookup table 450. If the address is in the list, remap module 435 may assign one or more different addresses for storing the data. Furthermore, when a read access from request generator 420 requests access to an address that is remapped due to a degraded storage block in accordance with the lookup table, remap module 435 may identify the new address for the read request.

Figure 5:
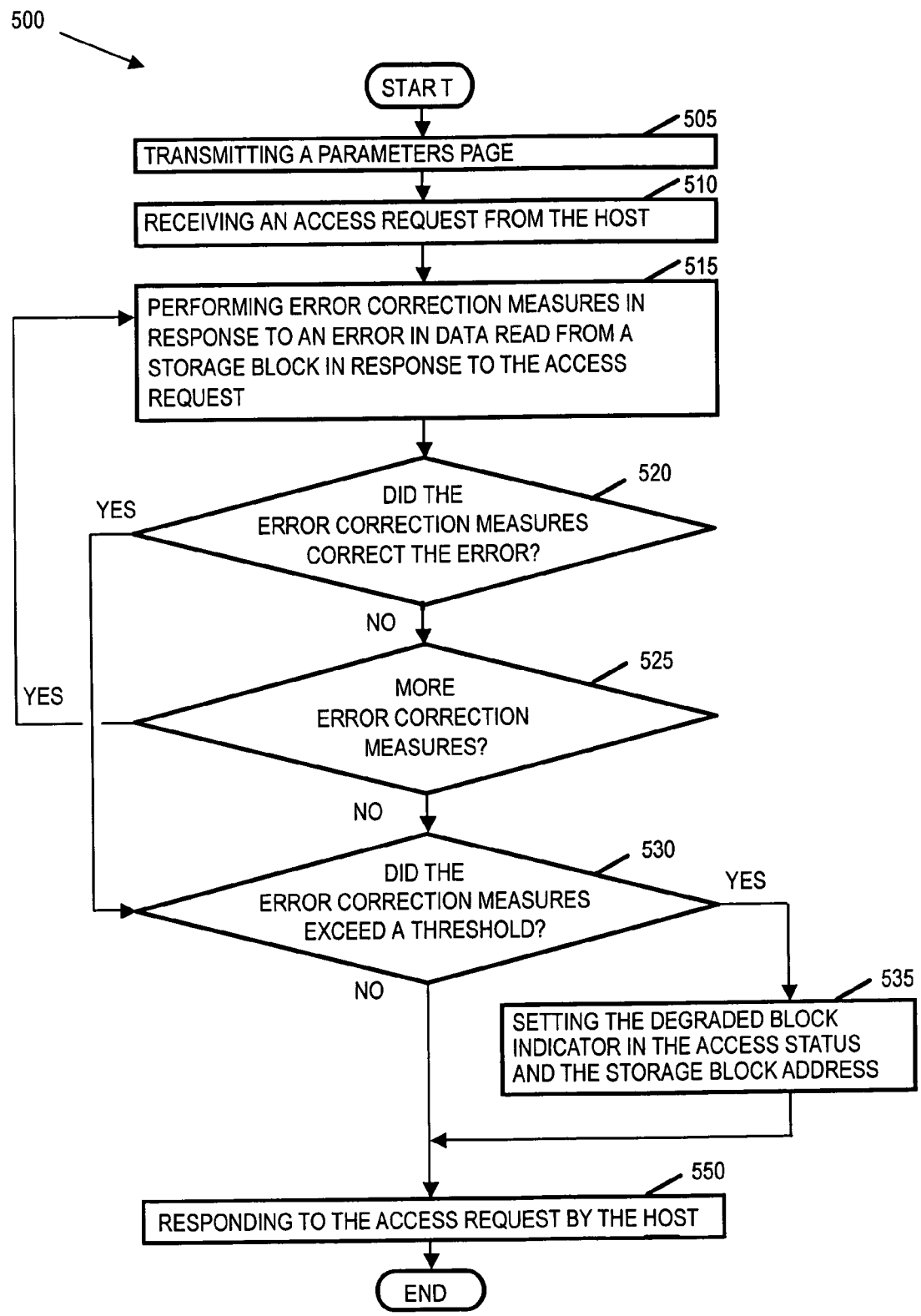
FIG. 5 depicts a flowchart of an embodiment to pass responsibility of remapping to a host and notify the host of degradation of a storage block.

FIG. 5 depicts a flowchart 500 of an embodiment of a storage device interface such as the storage device interface in FIG. 1 to pass responsibility of remapping to a host and to notify the host of degradation of a storage block. Flowchart 500 begins with transmitting a parameters page with data to indicate that the host is to handle remapping (element 505). In some embodiments, the host may initiate communications by first issuing a request to identify whether a device is connected and what type of device is connected. The storage device interface may respond with an initial register image that comprises a unique interface identifier, an extended command set identifier, a signature, or other form of indication for the host. Upon receipt of the initial register image, the host may issue, e.g., an IDENTIFY DEVICE command to determine actual operational parameters for the storage device interface. For instance, the host may be designed to remap data if the data storage interface indicates that it is capable of passing that function to the host.

Once communications are initiated, the data storage interface may receive an access request from the host (element 510). The access request may comprise a read request to read data from a number of storage blocks of the data storage medium managed by the data storage interface. And, in other situations, the access request may comprise a write request for a number of storage blocks.

After reading the data from the storage block(s), or writing the data and reading that data back to verify the write, the data storage device may detect an error in the data read during validation of the data read. For instance, the ECC bits included with the data may not verify the validity of the data. In response, the data storage device may perform error correction measures to correct the error in the data read from one or more of the data blocks (element 515). If the initial error correction measures do not resolve the error (element 520), additional error correction measures may be executed to attempt to read valid data from the one or more storage blocks when more error correction measures are available (element 525).

On the other hand, if the error appears to be corrected or all error correction measures are exhausted, the error correction measures may terminate. If the error correction measures did not correct the error (element 520) and no more error measures are available (element 525), error correction measures have exceeded a threshold (element 530) and the data storage interface may set an indicator for a degraded block in the access status register. The data storage interface may also store a storage address in the command response register to indicate that one or more storage blocks in the region of the storage address appear to be degraded to a point at which the host should remap the block(s) (element 535).

On the other hand, if the error correction measures corrected the error but exceeded a threshold selected to determine that the storage block(s) appear to be degraded beyond a point of feasible utility or degraded to a point beyond which the risk of data loss exceeds a threshold (element 530), the address of at least one of the storage block(s) may be stored in the command response register and the degraded block indicator may be set in the access status register (element 535). The data storage interface may then respond to the access request and the response may include access status register and/or the command status register. For example, in some embodiments, both the access status register and the command status register may be included in each response to an access request to communicate information related to degraded storage blocks to the host.

Figure 6:
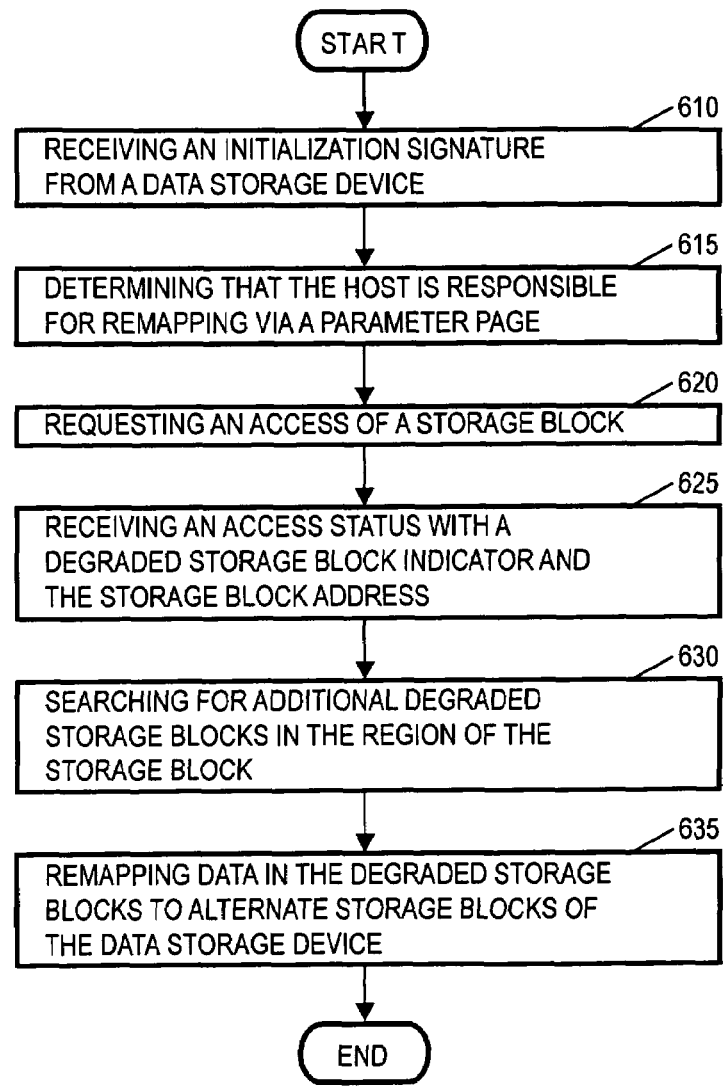
FIG. 6 depicts a flowchart of an embodiment of a host to assume responsibility for remapping around degraded blocks of a data storage device.

FIG. 6 depicts a flowchart 600 of an embodiment of a host such as the host in FIG. 1 to take over responsibility for remapping around degraded blocks from a data storage device. Flowchart 600 begins with receiving an initialization signature from a data storage device (element 610). For example, upon the first power up of the host or upon each power up, the host may request communication from the attached data storage device. The initialization signature may describe the type and revision of the data storage device interface so that the host executes the correct and most recent protocol available for communications with the data storage device.

Upon the identification of the interface in the initialization signature, the host may request specific operating parameters from the data storage device. The data storage device may return the operating parameters and, based upon the operating parameters, the host may determine that the host will be responsible to remap data in degraded storage blocks detected by the data storage device (element 615). More specifically, the data storage device will detect the degraded storage block and will inform the host of the degraded storage blocks encountered during accesses. However, the data storage device will not remap data from those degraded storage blocks to other storage blocks. In several embodiments, the host may acknowledge the assumption of remapping functionality.

Upon establishment of communications between the data storage device and initialization of the appropriate communications protocols, the host may request an access of a storage block of the data storage device (element 620). For instance, the host may generate a request to read the content of a storage block. After the data storage device executes or attempts to execute the request, the data storage device may return an access status with an indication of whether a storage block is degraded, and if there is a degraded storage block then responds with the address of a storage block in the degraded region (element 625). Such a response may be indicative of the degradation of that storage block and, in some embodiments, degradation of other storage blocks in the region of the address for that storage block. In further embodiments, the extent of the region may be provided in the response or in the initialization signature. For example, the initialization signature may provide a list of defects known by the device at start-up (often called the permanent defect list). The permanent defect list may also include grown defects over time. In the present embodiment, the extent of the region is established via the communications protocols.

After receiving the response for the access, the host may search for degraded storage blocks in the region of the address provided by in the response (element 630). For example, the host may incrementally access each of the storage blocks in the region and await a response from the data storage device to determine whether the storage block is degraded beyond feasible utility. Once the host completes the search for the degraded storage blocks, the host may remap data in or bound for the degraded storage blocks to alternate storage blocks in the data storage device (element 635).

Another embodiment of the invention is implemented as a program product for use with a system to perform processes such as the processes described in conjunction with system 100 as illustrated in FIG. 1. The program(s) of the program product defines functions of the embodiments (including the methods described herein) and can be contained on a variety of data and/or signal-bearing media. Illustrative data and/or signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet and other networks. Such data and/or signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by a computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

It will be apparent to those skilled in the art having the benefit of this disclosure that the present invention contemplates systems and arrangements to remap data from bad or degraded storage blocks. It is understood that the form of the invention shown and described in the detailed description and the drawings are to be taken merely as examples. It is intended that the following claims be interpreted broadly to embrace all the variations of the embodiments disclosed.

Although the present invention and some of its advantages have been described in detail for some embodiments, it should be understood that various changes, substitutions and alterations can be made herein without departing from the spirit and scope of the invention as defined by the appended claims. Although an embodiment of the invention may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
performing, by a storage device, error correction measures to acquire data from a storage medium of the storage device in response to an error detected in the data read from the storage medium;
determining, by the storage device, that a storage block of the storage medium is degraded based upon the error; and
communicating, by the storage device, degradation of the storage block to a host to prompt the host to remap the data to another storage block, wherein the host is not part of the storage device.

2. The method of claim 1, further comprising notifying the host that the host is responsible for tracking degraded storage blocks.

3. The method of claim 2, wherein notifying comprises setting an indicator in a parameters page of the storage device.

4. The method of claim 1, further comprising notifying the host of one or more degraded storage blocks in an initialization signature of the storage device.

5. The method of claim 1, wherein performing comprises executing an error correction code (ECC).

6. The method of claim 1, wherein performing comprises rereading the data from the storage medium when low-level error correction code is unable to produce valid data.

7. The method of claim 1, wherein determining comprises determining that the error correction measures to acquire the data exceed a threshold, the threshold selected to be indicative of the degradation of the storage block.

8. The method of claim 1, wherein determining comprises determining that the number of bits corrected in the storage block reaches a threshold number of bits.

9. The method of claim 1, wherein communicating comprises indicating to the host that excessive error correction was implemented to acquire the data from the storage block.

10. The method of claim 1, wherein communicating comprises indicating to the host an extent of the error correction measures implemented to acquire the data from the storage block to allow the host to determine whether the extent warrants remapping the data.

11. The method of claim 1, wherein communicating comprises transmitting an address for the storage block to the host, wherein the storage block is the first degraded storage block encountered during an access of the storage medium.

12. The method of claim 1, wherein communicating comprises transmitting, to the host, an address in a region of the storage block.

13. A data storage device comprising:
error correction module to perform error correction measures to acquire data from a storage medium of the data storage device in response to an error detected in the data read from the storage medium;
a degraded block identifier to identify a degraded storage block of the storage medium based upon the error; and
a degraded block indicator to communicate the degraded storage block to a host to prompt the host to remap the data to another storage block, wherein the host is not part of the data storage device.

14. The data storage device of claim 13, further comprising a notification module to notify the host that the host is responsible for tracking the degraded storage block.

15. The data storage device of claim 14, wherein the notification module is to set an indicator in a parameters page of the storage device, wherein the indicator indicates that the host should track degraded storage blocks.

16. The data storage device of claim 13, wherein the error correction module comprises a processor to execute an error correction code (ECC) to acquire data from the storage medium.

17. The data storage device of claim 13, wherein the error correction module comprises logic to reread the data from the storage medium and correct the data with a higher-level error correction code when the data as initially read from the storage medium is irreparable via a low-level error correction code.

18. The data storage device of claim 13, wherein the degraded block identifier comprises logic to determine that the error correction measures to acquire the data exceed a threshold, the threshold selected to be indicative of the degradation of the degraded storage block to a point at which the data should be remapped to avoid potential loss of the data.

19. The data storage device of claim 13, wherein the degraded block indicator comprises logic to set an indicator in an access status register to indicate to the host an extent to which the error correction measures were implemented to acquire the data from the degraded storage block.

20. The data storage device of claim 13, wherein the degraded block indicator comprises an address identifier to transmit an address for the degraded storage block to the host.

21. A system comprising:
a host to receive an indication that a first storage block is degraded and, in response, to remap data from the first storage block to a second storage block; and
a data storage device coupled with the host to perform error correction measures to acquire the data from a storage medium of the data storage device for the host in response to an error detected by the data storage device in the data read from the storage medium; to determine that the first storage block of the storage medium is degraded based upon the error; and to communicate an indication that the first storage block is degraded to the host.

22. The system of claim 21, wherein the host comprises a remap interpreter to start tracking degraded storage blocks in response to a communication with the data storage device.

23. The system of claim 21, wherein the host comprises a degraded block tracker to track the first storage block in response to an indication from the data storage device that the first storage block appears to be degraded.

24. The system of claim 21, wherein the host comprises a remap module to change locations of the data on the storage medium based upon identification of degraded storage blocks.

25. The system of claim 21, wherein the host comprises a degraded block identifier to determine additional degraded storage blocks in response to identification of an address range associated with the first storage block.

26. The system of claim 21, wherein the data storage device comprises a degraded block identifier to determine that the error correction measures to acquire the data exceed a threshold.

27. A machine-accessible, data storage medium containing instructions, which when executed by a storage device, cause the storage device to perform operations, the operations comprising:
performing error correction measures to acquire data from a storage medium of the storage device in response to an error detected in the data read from the storage medium;
determining that a storage block of the storage medium is degraded based upon the error; and
communicating degradation of the storage block to a host to prompt the host to remap the data to another storage block, wherein the host is not part of the storage device.

28. The machine-accessible, data storage medium of claim 27, wherein the operations further comprise notifying the host that the host is responsible for tracking degraded storage blocks.

29. The machine-accessible, data storage medium of claim 27, wherein determining comprises determining that the error correction measures to acquire the data exceed a threshold, the threshold selected to be indicative of the degradation of the storage block.

30. The machine-accessible, data storage medium of claim 27, wherein communicating comprises transmitting an address for the storage block to the host.

* * * * *